United States Patent
Korevaar et al.

(10) Patent No.: US 8,962,978 B2
(45) Date of Patent: Feb. 24, 2015

(54) COMPOSITIONALLY-GRADED AND STRUCTURALLY-GRADED PHOTOVOLTAIC DEVICES AND METHODS OF FABRICATING SUCH DEVICES

(75) Inventors: Bastiaan Arie Korevaar, Schenectady, NY (US); James Neil Johnson, Scotia, NY (US); Todd Ryan Tolliver, Clifton Park, NY (US); Theodore Carlton Kreutz, Rensselaer, NY (US); Xiaolan Zhang, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 193 days.

(21) Appl. No.: 12/959,631

(22) Filed: Dec. 3, 2010

(65) Prior Publication Data

US 2011/0067753 A1 Mar. 24, 2011

Related U.S. Application Data

(62) Division of application No. 12/113,045, filed on Apr. 30, 2008, now Pat. No. 7,906,723.

(51) Int. Cl.
*H01L 31/0368* (2006.01)
*H01L 31/0352* (2006.01)
(Continued)

(52) U.S. Cl.
CPC ......... *H01L 31/03529* (2013.01); *Y02E 10/548* (2013.01); *H01L 31/03682* (2013.01);
(Continued)

(58) Field of Classification Search
CPC ............ H01L 31/065; H01L 31/03682; H01L 31/03762
USPC .......................................... 136/255, 258, 261
See application file for complete search history.

(56) References Cited

U.S. PATENT DOCUMENTS

| 4,001,864 A | 1/1977 | Gibbons |
| 4,224,084 A * | 9/1980 | Pankove ...................... 257/646 |

(Continued)

FOREIGN PATENT DOCUMENTS

| EP | 0198196 B1 | 2/1993 |
| EP | 0364780 B1 | 3/1997 |

(Continued)

OTHER PUBLICATIONS

Chatterjee, "A Computer Analysis of the Effect of a Wide-Band-Gap Emitter Layer on the Performance of a-Si:H-Based Heterojunction Solar Cells", J. Appl. Phys., vol. 79, No. 9, pp. 7339-7347, May 1, 1996.

(Continued)

*Primary Examiner* — Allison Bourke (74) *Attorney, Agent, or Firm* — Paul J. DiConza (57) ABSTRACT

A semiconductor structure is described, including a semiconductor substrate and a semiconductor layer disposed on the semiconductor substrate. The semiconductor layer is both compositionally graded and structurally graded. Specifically, the semiconductor layer is compositionally graded through its thickness from substantially intrinsic at the interface with the substrate to substantially doped at an opposite surface. Further, the semiconductor layer is structurally graded through its thickness from substantially crystalline at the interface with the substrate to substantially amorphous at the opposite surface. Related methods are also described.

4 Claims, 3 Drawing Sheets

(51) Int. Cl.
*H01L 31/0747* (2012.01)
*H01L 31/075* (2012.01)
*H01L 31/065* (2012.01)
*H01L 31/0376* (2006.01)

(52) U.S. Cl.
CPC .......... *H01L31/0747* (2013.01); *H01L 31/075* (2013.01); *H01L 31/065* (2013.01); *Y02E 10/546* (2013.01); *H01L 31/03762* (2013.01)
USPC ............................ 136/255; 136/258; 136/261

(56) References Cited

U.S. PATENT DOCUMENTS

| | | | |
|---|---|---|---|
| 4,392,011 A | | 7/1983 | Pankove et al. |
| 4,434,318 A | | 2/1984 | Gibbons |
| 4,681,984 A | | 7/1987 | Moeller |
| 5,213,628 A | | 5/1993 | Noguchi et al. |
| 5,252,142 A | | 10/1993 | Matsuyama et al. |
| 5,256,887 A | | 10/1993 | Yang |
| 5,401,336 A | | 3/1995 | Noguchi et al. |
| 5,589,008 A | | 12/1996 | Keppner |
| 5,643,638 A | | 7/1997 | Otto et al. |
| 5,648,675 A | | 7/1997 | Terada et al. |
| 5,677,236 A | * | 10/1997 | Saitoh et al. .................. 438/485 |
| 5,705,828 A | | 1/1998 | Noguchi et al. |
| 5,716,480 A | | 2/1998 | Matsuyama et al. |
| 6,043,427 A | * | 3/2000 | Nishimoto .................... 136/258 |
| 6,472,248 B2 | | 10/2002 | Shiozaki et al. |
| 6,667,434 B2 | | 12/2003 | Morizane et al. |
| 6,670,542 B2 | | 12/2003 | Sakata et al. |
| 6,812,499 B2 | | 11/2004 | Kondo et al. |
| 2002/0063303 A1 | | 5/2002 | Pauchard et al. |
| 2002/0069911 A1 | | 6/2002 | Nakamura et al. |
| 2003/0145884 A1 | | 8/2003 | King et al. |
| 2003/0168660 A1 | | 9/2003 | Terakawa et al. |
| 2004/0046497 A1 | | 3/2004 | Schaepkens et al. |
| 2005/0062041 A1 | | 3/2005 | Terakawa et al. |
| 2005/0151131 A1 | | 7/2005 | Wager, III et al. |
| 2006/0255340 A1 | | 11/2006 | Manivannan et al. |
| 2007/0023081 A1 | * | 2/2007 | Johnson et al. ................ 136/258 |
| 2007/0023082 A1 | * | 2/2007 | Manivannan et al. ........ 136/258 |
| 2008/0173347 A1 | * | 7/2008 | Korevaar et al. .............. 136/255 |

FOREIGN PATENT DOCUMENTS

| | | | | |
|---|---|---|---|---|
| EP | 0494088 B1 | | 2/1999 | |
| JP | 62132372 A | * | 6/1987 | ............. H01L 31/04 |
| JP | 62-209871 | | 9/1987 | |
| JP | 62209871 A | * | 9/1987 | ............. H01L 31/04 |
| JP | 01-164072 | | 12/1987 | |
| JP | 63-058974 | * | 3/1988 | |
| JP | 04-245683 | * | 9/1992 | |
| JP | 04245683 A | * | 9/1992 | ............. H01L 31/04 |

OTHER PUBLICATIONS

Fujiwara et al., "Real-Time Monitoring and Process Control in Amorphous/Crystalline Silicon Heterojunction Solar Cells by Spectroscopic Ellipsometry and Infrared Spectroscopy", Applied Physics Letter, vol. 86, pp. 032112-1 to 032112-3, 2005.

Knauss et al., "Emitter Wrap Through Solar Cells Using Electroless Plating Metallisation", University of Konstanz, Department of Physics, Konstanz, Germany, 4 pages, 2001.

Gee et al., "Simplified Module Assembly Using Back-Contact Crystalline-Silicon Solar Cells", 26th IEEE Photovoltaic Specialist Conference, Sep. 29-Oct. 3, 1997, Anaheim, California, 5 pages, Sep. 1997.

Lim et al., "A Novel Structure, High Conversion Efficiency p-SiC/graded p-SiC/i-Si/n-Si/Metal Substrate-Type Amorphous Silicon Solar Cell", J. Appl. Phys., vol. 56, No. 2, pp. 538-542, Jul. 15, 1984.

* cited by examiner

COMPOSITIONALLY-GRADED AND STRUCTURALLY-GRADED PHOTOVOLTAIC DEVICES AND METHODS OF FABRICATING SUCH DEVICES

CROSS-REFERENCE TO RELATED APPLICATIONS

This application is a divisional of application Ser. No. 12/113,045, filed 30 Apr. 2008, which is hereby incorporated by reference herein in its entirety. Non-Provisional application Ser. No. 11/263,159, filed on Oct. 31, 2005, which claims priority to provisional application Ser. No. 60/704,181 filed on Jul. 28, 2005, is hereby incorporated by reference.

BACKGROUND OF THE INVENTION

This invention relates generally to the field of semiconductor devices which include a heterojunction, such as a photovoltaic device.

Devices which rely on the presence of a heterojunction are well-known in the art. As used in this context, a heterojunction is usually formed by contact between a layer or region of one conductivity type with a layer or region of opposite conductivity (e.g., a "p-n" junction). Examples of these devices include thin film transistors, bipolar transistors, and photovoltaic devices (e.g., solar cells).

Photovoltaic devices convert radiation, such as solar, incandescent, or fluorescent radiation, into electrical energy. Sunlight is the typical source of radiation for most devices. The conversion to electrical energy is achieved by the well-known photovoltaic effect. According to this phenomenon, radiation striking a photovoltaic device is absorbed by an active region of the device, generating pairs of electrons and holes, which are sometimes collectively referred to as "photo-generated charge carriers." The electrons and holes diffuse, and are collected at the contacts, often using an electric field built into the device.

The increasing interest in solar cells as a reliable form of clean, renewable energy has prompted great efforts in increasing the performance of the cells. One primary measurement for such performance is the energy conversion efficiency of the device. Conversion efficiency is usually measured as the amount of electrical energy generated by the device, as a proportion of the light energy which contacts its active surface. Even small increases in energy conversion efficiency, e.g., 1% or less, represent very significant advances in photovoltaic technology.

The performance of photovoltaic devices depends in large part on the composition and microstructure of each semiconductor layer. Specifically, crystalline semiconductor layers may introduce a number of undesirable defects to the device. For example, defect states which result from structural imperfections or impurity atoms may reside on the surface or within the bulk of monocrystalline semiconductor layers. Moreover, polycrystalline semiconductor materials may contain randomly-oriented grains, with grain boundaries which induce a large number of bulk and surface defect states.

The presence of various defects of this type can be the source of deleterious effects in the photovoltaic device. For example, many of the charge carriers recombine at the defect sites near the heterojunction, instead of continuing on their intended pathway to one or more collection electrodes. Thus, they become lost as current carriers. Recombination of the charge carriers is one of the chief reasons for decreased energy conversion efficiency.

The negative effects of surface defects can be minimized to some degree by passivation techniques. For example, a layer of intrinsic (i.e., undoped) semiconductor material can be formed on the surface of the crystalline substrate. The presence of this intrinsic layer decreases the recombination of charge carriers at the substrate surface, and thereby improves the performance of the photovoltaic device.

The concept of using this type of intrinsic layer is generally described in U.S. Pat. No. 5,213,628 (Noguchi et al). Noguchi describes a photovoltaic device which includes a monocrystalline or polycrystalline semiconductor layer of a selected conductivity type. A substantially intrinsic layer of 250 Angstroms or less is formed over the substrate. A substantially amorphous layer is formed over the intrinsic layer, having a conductivity opposite that of the substrate, and completing a "semiconductor sandwich structure". The photovoltaic device is completed by the addition of a light-transparent electrode over the amorphous layer, and a back electrode attached to the underside of the substrate.

The photovoltaic devices described in the Noguchi patent may considerably minimize the problem of charge carrier recombination in some situations. For example, the presence of the intrinsic layer at selected thicknesses is said to increase the photoelectric conversion efficiency of the device. Moreover, the concept of passivating the surfaces of semiconductor substrates in this manner has been described in a number of references since the issuance of Noguchi et al. Examples include U.S. Pat. No. 5,648,675 (Terada et al); and U.S. Patent Publications 2002/0069911 A1 (Nakamura et al): 2003/0168660 A1 (Terakawa et al); and 2005/0062041 A1 (Terakawa et al).

While the references mentioned above address the recombination problem to some degree, there are some considerable drawbacks remaining. For example, the presence of the intrinsic layer, while beneficial to some extent, results in the formation of yet another interface, i.e., between the intrinsic layer and the overlying amorphous layer. This new interface is yet another site for impurities and spurious contaminants to become trapped and to accumulate, and possibly cause additional recombination of the charge carriers. For example, interruptions between the deposition steps during fabrication of a multilayer structure can provide unwelcome opportunities for the entry of the contaminants.

Moreover, abrupt band bending at the interface, due to an abrupt change in conductivity, and/or variations in band gap, can lead to a high density of interface states and energetically favorable sinks for holes and electrons, which is another possible source of recombination.

With some of these concerns in mind, improved photovoltaic devices would be welcome in the art. The devices should minimize the problem of charge-carrier recombination at various interface regions between semiconductor layers. Moreover, the devices should exhibit electrical properties which ensure good photovoltaic performance, e.g., energy conversion efficiency. Furthermore, the devices should be capable of being made efficiently and economically. The fabrication of the devices should reduce the deposition steps which would allow the entry of excessive levels of impurities and other defects.

BRIEF DESCRIPTION OF THE INVENTION

In accordance with one embodiment of the invention, there is provided a semiconductor structure. The semiconductor structure comprises a semiconductor substrate. The semiconductor structure further comprises a semiconductor layer disposed on the semiconductor substrate, wherein the semiconductor layer is compositionally graded through its thickness from substantially intrinsic at the interface with the substrate to substantially doped at an opposite surface, and wherein the semiconductor layer is structurally graded through its thickness from substantially crystalline at the interface with the substrate to substantially amorphous at the opposite surface.

In accordance with another embodiment of the invention, there is provided a semiconductor structure. The semiconductor structure comprises a doped semiconductor substrate. The semiconductor structure further comprises an epitaxial layer formed on the doped semiconductor substrate, wherein the epitaxial layer comprises a substantially intrinsic crystalline phase. The semiconductor structure further comprises a semiconductor layer formed on the epitaxial layer, wherein the semiconductor layer is structurally graded through its thickness from a substantially crystalline phase at the interface with the epitaxial layer to a substantially amorphous phase.

In accordance with another embodiment of the invention, there is provided a semiconductor structure. The semiconductor structure comprises a semiconductor layer having a structurally graded region through a first depth from a substantially crystalline state at a lower portion of the structurally graded region to a substantially amorphous state at an upper portion of the structurally graded region.

In accordance with another embodiment of the invention, there is provided a method of depositing a semiconductor layer. The method comprises structurally grading the semiconductor layer through a first thickness. The method further comprises compositionally grading the semiconductor layer through a second thickness.

DETAILED DESCRIPTION OF THE INVENTION

A number of terms and concepts will be described, herein. To the extent that these terms are commonly used, the terms are intended to be ascribed their commonly understood meaning, as appreciated by those of ordinary skill in the art. For those terms without a particular meaning commonly understood by those skilled in the art, the terms will be understood by the descriptions provided herein, and the context in which these terms are being used in accordance with embodiments of the present invention.

As described further below, a number of materials or layers are said to be "formed on" or "disposed on" underlying materials or layers. As used herein, the use of the terms "formed on" or "disposed on" does not preclude the presence of additional materials or layers between the associated materials. That is, as used herein, the terms "formed on" or "disposed on" should not be limited to an interpretation analogous to "formed directly on" or "disposed directly on," but rather, should be interpreted to allow for any intervening layers formed or disposed therebetween.

As will be appreciated, a photovoltaic device or solar cell may include semiconductor layers stacked to provide a heterojunction (e.g., p-n junction). Silicon is a commonly employed semiconductor material in solar cells, based on the physical reaction of silicon when impinged by photons. As will be appreciated, silicon may be crystalline (e.g., monocrystalline or polycrystalline) or amorphous. Other forms of silicon exist (e.g., nanocrystalline or microcrystalline), but for the purposes of this disclosure, it is sufficient to understand the differences between crystalline and amorphous phases of silicon.

As will be appreciated, crystalline silicon (c-Si) is a four-fold coordinated atom that is typically tetrahedrally bonded to four neighboring silicon atoms. The tetrahedral structure is continued over a large range to form a well-ordered lattice (i.e., crystal). Crystalline silicon is employed as a substrate in many typical semiconductor devices, such as MOSFET and CMOS devices, including photovoltaic devices.

Amorphous silicon (a-Si) is the non-crystalline allotropic form of silicon. For amorphous silicon, the atoms form a continuous disordered (random) network, rather than the well-ordered lattice of crystalline silicon. Rather than each atom being four-fold coordinated, many of the atoms in amorphous silicon include dangling bonds which may be described as defects which are capable of producing undesirable electrical effects. Passivating the amorphous silicon with hydrogen reduces the negative effects of the dangling bonds. Despite the negative effects, amorphous silicon is often used in semiconductor devices because it is cheaper and easier to dispose in fabricating the semiconductor devices.

As will be described further below, in accordance with embodiments of the present invention, the semiconductor layers (e.g., silicon) of the photovoltaic device may be "structurally-graded" from a crystalline form to an amorphous form. As used herein, "structurally-graded" is meant to describe a gradual change (i.e., a "gradation") in the organization and structure of the semiconductor lattice from a crystalline form to an amorphous form. That is, the material is graded through its depth, such that the lattice starts with a well-organized crystalline form and gradually becomes less ordered and more random through the depth, such that it eventually becomes amorphous. In some embodiments, the gradation is substantially continuous, but this does not always have to be the case. For example, the rate-of-change may itself vary through the depth, increasing slightly in some regions, and decreasing slightly in others. However, the overall gradation is always characterized as a decrease in four-folded well-ordered atoms and an increase in dangling bonds through the depth of the structurally graded layer(s) or region in a direction moving away from the substrate. Any and all of these variations in gradations are meant to be encompassed by the term "structurally-graded". The advantages of such structural-grading and the mechanism for fabricating such structurally graded layers will be described further below.

As will also be appreciated, a semiconductor material, such as silicon, can be either undoped (i.e., intrinsic (i)), or doped (d). As will be described further below, a layer is said to be intrinsic (i), when there is substantially no dopant present in the material. In contrast, doped (d) layers, include n-type or p-type dopants. Those skilled in the art will appreciate the electrical properties of intrinsic versus doped semiconductor materials, such as silicon.

As will be described further below, in addition to the structural grading discussed above, embodiments of the present invention include semiconductor layers that are "compositionally-graded." As used herein, "compositionally-graded" is meant to describe a gradual change (i.e., a "gradation") in dopant concentration as a function of the depth of the semiconductor layer. In some embodiments, the gradation is substantially continuous, but this does not always have to be the case. For example, the rate-of-change in concentration may itself vary through the depth, increasing slightly in some regions, and decreasing slightly in others. However, the overall gradation is always characterized as a decrease in dopant concentration in the direction toward the substrate. Moreover, in some instances, the dopant concentration may remain constant for some portion of the depth, although that portion would probably be very small. Any and all of these variations in gradations are meant to be encompassed by the term "graded". The specific dopant concentration profile for a given semiconductor layer will depend on various factors, e.g., type of dopant, electrical requirements for the semiconductor device, the deposition technique for the compositionally-graded layer, as well as its microstructure and thickness.

Accordingly, embodiments of the present invention are directed to semiconductor devices, and more specifically photovoltaic devices, which include semiconductor layers which are structurally-graded or structurally-graded and compositionally-graded. In certain embodiments described below, the structurally-graded layer is formed independent of the formation of the compositionally-graded layer. In other embodiments, the structurally-graded regions and the compositionally-graded regions overlap, at least in part, and are formed in the same layer. Methods of fabricating devices having structurally-graded layers and devices having structurally-graded and compositionally-graded layers will be described, as well.

Figure 1:
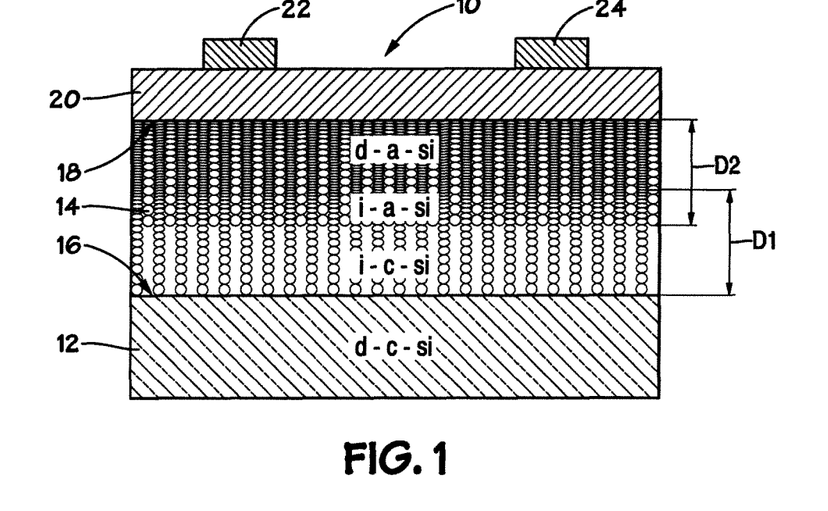
FIG. 1 is a schematic cross-section which depicts the structure of a photovoltaic device according to one embodiment of the present invention.

Turning now to FIG. 1, a partial cross-section of a device 10, in accordance with one embodiment of the present invention, is illustrated. The device 10, includes a substrate 12. A variety of substrate-types can be used for most embodiments of this invention. For example, a substrate 12 can be monocrystalline or polycrystalline. Moreover, the substrate material can be n-type or p-type, depending in part on the electrical requirements for the photovoltaic device. That is, the substrate 12 is doped (d) with n-type or p-type dopants. Those skilled in the art are familiar with the details regarding all of these types of silicon substrates.

During fabrication, the substrate 12 is usually subjected to conventional treatment steps, prior to deposition of the other semiconductor layers. For example, the substrate 12 can be cleaned and placed in a vacuum chamber (e.g., a plasma reaction chamber, as described below). The chamber can then be heated to temperatures sufficient to remove any moisture on or within the substrate. Usually, a temperature in the range of about 120-240° C. is sufficient. Sometimes, hydrogen gas is then introduced into the chamber, and the substrate is exposed to a plasma discharge, for additional surface-cleaning. However, many variations on cleaning and pretreatment steps are possible.

The various semiconductor layers formed over the substrate are typically applied by plasma deposition. Many different types of plasma deposition are possible. Non-limiting examples include chemical vapor deposition (CVD); vacuum plasma spray (VPS); low pressure plasma spray (LPPS), plasma-enhanced chemical-vapor deposition (PECVD), radio-frequency plasma-enhanced chemical-vapor deposition (RF-PECVD); expanding thermal-plasma chemical-vapor deposition (ETP-CVD); electron-cyclotron-resonance plasma-enhanced chemical-vapor deposition (ECR-PECVD), inductively coupled plasma-enhanced chemical-vapor deposition (IC-PECVD), and air plasma spray (APS). Sputtering techniques could also be used, e.g., reactive sputtering. Moreover, combinations of any of these techniques might also be employed. Those skilled in the art are familiar with the general operating details for all of these deposition techniques. Alternatively, in certain instances, a semiconductor layer may be grown, by epitaxial growth for example.

Referring again to FIG. 1, a semiconductor layer 14 is formed on the semiconductor substrate 12. The semiconductor layer 14 may be silicon, for example. As described further below, the semiconductor layer 14 is structurally graded from crystalline to amorphous through a depth D1 which begins at the interface 16 between the substrate 12 and the semiconductor layer 14 and ends at a depth within the semiconductor layer 14 that is less than the thickness of the semiconductor layer 14. Further, and as described further below, the semiconductor layer 14 is compositionally graded, in terms of dopant concentration. That is, the dopant concentration is substantially zero (intrinsic) at a depth D2, measured from the interface 18 between the semiconductor layer 14 and the overlying transparent conductive film 20 (described further below), gradually increasing through the depth D2, until the dopant concentration is at a maximum, in terms of semiconductor conductivity objectives, at the interface 18.

Thus, as described above, the semiconductor layer 14 is both structurally-graded and compositionally graded. Specifically, the structural-grading of the semiconductor layer 12 from a crystalline form to an amorphous form from the interface 16 through a depth D1. That is, a first region of the semiconductor layer 14 gradually changes (i.e., a "gradation") in the organization and structure of the semiconductor lattice from a crystalline form to an amorphous form. In this first region, defined by the depth D1, the lattice starts with a well-organized crystalline form at the interface 16 and gradually becomes less ordered and more random through the depth D1, such that it eventually becomes amorphous. While the structurally graded region, defined by the depth D1, is illustrated as terminating partially through the semiconductor layer 14, in other embodiments, the structural grading may continue from the interface 16, through the entire thickness of the semiconductor material 14, to the interface 18. The structural-grading of the first region of the semiconductor layer 14 will be described further below.

In addition to the structural-grading, the semiconductor layer 14 of the device 10 is compositionally-graded from intrinsic to doped through a second region, defined by the depth D2. That is, the second region of the semiconductor layer 14 gradually changes (i.e., a "gradation") in dopant concentration from being intrinsic at the beginning of the second region, to being maximally doped (either n-type or p-type) at the interface 18. As will be appreciated, the dopant type will depend on the dopant type of the substrate 12. The dopant type of the substrate 12 will be opposite the dopant type of the semiconductor layer 14 to provide a heterojunction between the substrate 12 and the semiconductor layer 14, albeit, through an intrinsic layer or region. As will be appreciated, a heterojunction having oppositely doped semiconductor layers sandwiched about an intrinsic portion (known as a "HIT structure") to form a p-i-n or an n-i-p structure is another commonly used modification of the heterojunction.

It should be noted, that as used herein, the crystalline form, or crystalline phase refers to a layer that is substantially crystalline at the interface 18. That is, the layer is said to be crystalline or substantially crystalline if a film of at least a few monolayers of crystalline material is intentionally grown crystalline. It should be noted that this is distinguishable from small crystalline features that may be unintentionally formed through processing, such that crystalline pockets are formed at the interface, which very quickly breaks up and become amorphous. These smaller crystals are by themselves often epitaxial in nature with the substrate, but are highly disruptive and non-uniform, rather than highly structured as in a crystalline form. The grain-boundaries of the small, non-uniform crystals are often of significantly high density such that a large interface density occurs (>10e12 cm-3) lowering the Voc of the devices. In accordance with embodiments of the present techniques, a thin crystalline film of a few monolayers is formed, in which the width of the crystals is substantially wider than the thickness of the film, in that way reducing the number of defects at the interface.

In some embodiments, the gradation of dopant through the compositionally graded region is substantially continuous. Alternatively, the rate-of-change in concentration may itself vary through the depth D2 of the region, increasing slightly in some regions, and decreasing slightly in others. Moreover, in some instances, the dopant concentration may remain constant for some portion of the depth. Any and all of these variations in dopant gradations are meant to be encompassed by the term "compositionally-graded". The specific dopant concentration profile for a given semiconductor layer will depend on various factors, including type of dopant, electrical requirements for the semiconductor device 10, the deposition technique for disposing the semiconductor layer 14, as well as the microstructure and thickness of the semiconductor layer 14. Further, while the compositionally-graded region, defined by the depth D2, is illustrated as beginning partially through the semiconductor layer 14 (from the interface 16) and terminating at the interface 18, in other embodiments, the compositional grading may continue from the interface 16, through the entire thickness of the semiconductor material 14, to the interface 18. The compositional-grading of the second region of the semiconductor layer 14 will be described further below.

In the illustrated embodiment of FIG. 1, the first graded region (structural), defined by the depth D1, and the second graded region (compositional), defined by the depth D2 partially overlap. As will be illustrated in FIG. 3, in alternate embodiments, the graded regions may be separate layers, (i.e., formed during different processing steps) and may not overlap. Further, in other embodiments, and as illustrated in FIG. 4, the compositional grading, defined through the depth D2, may begin before the structural grading, defined through the depth D1. Alternatively, the first and second regions may completely overlap, such that the structural grading and the compositional grading each occur through the entire depth of the semiconductor layer 14. Alternatively, one region may be contained completely within another. For example, the structural grading may occur throughout the entire layer from one interface 16 to the other interface 18, while the compositional grading occurs from a starting point within the semiconductor layer 14 (i.e., at some distance closer to the interface 16 than to the interface 18) and ends within the semiconductor layer 14 (i.e., at some distance closer to the interface 18 than to the interface 16).

The thickness of the semiconductor layer 14 will also depend on various factors, such as the type of dopant employed, the conductivity-type of the substrate, the grading profile, the desired dopant concentration at the interface 18, and the optical band gap of semiconductor layer 14. Usually, the thickness of the semiconductor layer 14 is less than or equal to about 250 Angstroms. In some specific embodiments, the semiconductor layer 14 has a thickness in the range of about 30 Angstroms to about 180 Angstroms. The most appropriate thickness in a given situation can be determined without undue effort, e.g., by taking measurements related to the photoelectric conversion efficiency of the device, as well as its open circuit voltage ($V_{oc}$) and short circuit current ($I_{sc}$).

Referring again to FIG. 1, in many embodiments, a transparent conductive film 20 is disposed on semiconductor layer 14, on the light-receiving side of the photovoltaic device 10. Film 20 functions as part of the front electrode of the device. The transparent conductive film can comprise a variety of materials, such as metal oxides. Non-limiting examples include zinc oxide (ZnO) and indium tin oxide (ITO). Film 20 can be formed by various conventional techniques, such as sputtering or evaporation. Its thickness will depend on various factors, such as the anti-reflective (AR) characteristics of the material. Usually, transparent conductive film 20 will have a thickness in the range of about 200 Angstroms to about 1500 Angstroms.

Metal contacts 22 and 24 are disposed on the conductive film 20. The contacts serve as conducting electrodes, and convey the electric current generated by the photovoltaic device to a desired location. They can be formed of a variety of conductive materials, such as silver (Ag), aluminum (Al), copper (Cu), molybdenum (Mo), tungsten (W), titanium (Ti), and various combinations thereof. Moreover, their shape, size, and number can vary, depending in part on the layer structure and electrical configuration of the device. The metal contacts can be formed by various techniques, e.g., plasma deposition, screen printing or other printing methods; vacuum evaporation (sometimes using a mask); sputtering; pneumatic dispensing; or direct-write techniques such as ink jet printing.

As will be appreciated, a back electrode (not shown) may be formed on the reverse side of substrate 12 (opposite the semiconductor layer 14). The back electrode performs a function similar to that of contacts 22 and 24, in conveying electric current generated by the photovoltaic device 10. The back electrode can comprise a wide variety of materials, such as aluminum, silver, molybdenum, titanium, tungsten, and various combinations thereof. Moreover, it can be formed by any conventional technique, such as vacuum evaporation, plasma spraying, sputtering, and the like. As in the case of the other layers, the thickness of the back electrode will depend on various factors. Typically, it has a thickness of about 500 Angstroms to about 3000 Angstroms. In some cases, a buffer layer (not shown) can be formed between back electrode and the reverse side of substrate 12, e.g., when a diffusion barrier between materials like aluminum and silicon may be desirable. Alternatively, the back electrode may be substantially the same as the front electrode, resulting in the formation of a bi-facial device. Further, the backside may also include structurally and compositional graded semiconductor layers, as described above.

As described further below with regard to FIG. 5, structural grading of the semiconductor layer 14, to gradually transition from a crystalline state to an amorphous state through a depth D1, may be accomplished by slowly introducing a dopant in the plasma, while the semiconductor layer 14 is being grown. For instance, if the underlying substrate 12 is a p-type material, an n-type dopant, such as phosphorus or arsenic, may be added to the plasma during growth or deposition. If the underlying substrate 12 is an n-type material, a p-type dopant, such as boron or gallium may be added to the plasma. By slowly adding a dopant during formation of the semiconductor layer 14, the layer 14 will gradually transition from a crystalline state to an amorphous state. As will be appreciated, the exact gas-flows depend on the size of the deposition chamber employed. In alternate embodiments, the hydrogen flow may be decreased to disrupt the crystalline growth. Alternatively, the plasma power in the chamber may be varied. Still further, varying the silane and/or argon flow and/or pressure in the chamber may also be used to disrupt the crystalline growth and gradually transition the undoped semiconductor layer 14 from a crystalline state to an amorphous state. As will also be described further below with regard to FIG. 2, an epitaxial intrinsic layer may be grown in a crystal state, before adding boron to the plasma, thus forming a thin epitaxial layer before the grading of the semiconductor layer 14 begins (i.e., before slowly adding a dopant to the plasma stream). As will be appreciated, the dopant concentration should be sufficiently low to mitigate formation of a barrier. It will be appreciated that crystalline silicon, for instance, dopes more effectively than amorphous silicon. By introducing small amounts of dopant, the crystal growth of the semiconductor layer 14 is interrupted just enough to create an amorphous state in the semiconductor layer 14, after a certain thickness has been achieved.

The structural-grading of the semiconductor layer 14 can be carried out by various techniques. Usually, grading is accomplished by adjusting the dopant levels during plasma deposition, as described above. In a typical embodiment, a silicon precursor gas such as silane ($SiH_4$) is introduced into the vacuum chamber in which the substrate is situated. A diluting gas such as hydrogen may also be introduced with the silicon precursor gas. Flow rates for the precursor gas can vary considerably, but are typically in the range of about 10 sccm to about 60 sccm for small area reactors used for deposition of 4" wafers, for instance, but are considerably larger for large area reactors. During the initial stages of deposition, no dopant precursors are present. Therefore, the semiconductor layer 14 is substantially intrinsic and crystalline, thus serving to passivate the surface of substrate 12.

As the deposition process continues, a dopant precursor is added to the plasma mixture. Choice of a precursor will of course depend on the selected dopant, e.g., n-type dopants such as phosphorus (P), arsenic (As), and antimony (Sb); or p-type dopants such as boron (B) or Gallium (Ga). Several non-limiting examples of dopant compounds can be provided: diborane gas ($B_2H_6$) or trimethylborane (TMB) for the p-type dopant, or phosphine ($PH_3$) for the n-type dopant. The dopant gasses may be in pure form, or they may be diluted with a carrier gas, such as argon, hydrogen, or helium, or another process gas, such as silane.

The addition of the dopant gas is carefully controlled, to provide the desired doping profile. Those skilled in the art are familiar with gas metering equipment, e.g., mass flow controllers, which can be used to carry out this task. The feed rate for the dopant gas will be selected to substantially match the gradation scheme described above. Thus, in very general terms, the feed rate of the dopant gas will gradually increase during the deposition process. However, many specific changes in feed rate can be programmed into the deposition scheme.

Advantageously, by structurally grading the semiconductor layer 14 from a crystalline state to an amorphous state, the tunnel barrier for the holes on the front side of the device 10 is decreased. Thus, in accordance with embodiments of the present invention, rather than having an amorphous intrinsic layer in direct contact with the substrate 12 at the interface 16, there is a thin crystalline region. By providing the crystalline intrinsic region at the interface 16, the fill factor improves, thereby improving overall cell efficiency. Specifically, the tunnel-barrier for the holes on the front side of the device has become much smaller. The barrier can be reduced by structurally grading a region of the semiconductor layer (e.g., through a depth D1), such that the band-bending is less abrupt.

As discussed further below with regard to FIG. 5, a second region, defined by the depth D2, of the semiconductor layer 14 may be compositionally graded from an intrinsic state to a doped state. The dopant concentration in the semiconductor layer 14 is substantially zero at the beginning of the region defined by the depth D2, regardless of the particular dopant profile. Thus, an intrinsic-amorphous region is present at the beginning of the region, functioning to prevent recombination of the charge-carriers. As will be appreciated, because the semiconductor layer 14 of FIG. 1 includes overlapping grading regions (structural through the depth D1 and compositional through the depth D2), the semiconductor layer 14 may still be in a crystalline state when the compositional grading begins. At the opposite, upper surface of semiconductor layer 14, i.e., at the interface 18, the semiconductor layer 14 is substantially conductive. Accordingly, at the interface 18, the semiconductor layer 14 is both amorphous (from the structural grading) and doped (from the compositional grading). Thus, at the interface 18, the semiconductor layer 14 has a dopant opposite that of the substrate 12. Thus, at least a portion of the semiconductor layer 14 forms a heterojunction with the substrate. The specific dopant concentration in the upper region will depend on the particular requirements for the semiconductor device. As a non-limiting example in the case of a polycrystalline or single crystalline silicon substrate, the upper region of the semiconductor layer 14, near the interface 18 will have a concentration of dopant in the range of about $1 \times 10^{18}$ cm$^{-3}$ to about $1 \times 10^{21}$ cm$^{-3}$.

Figure 2:
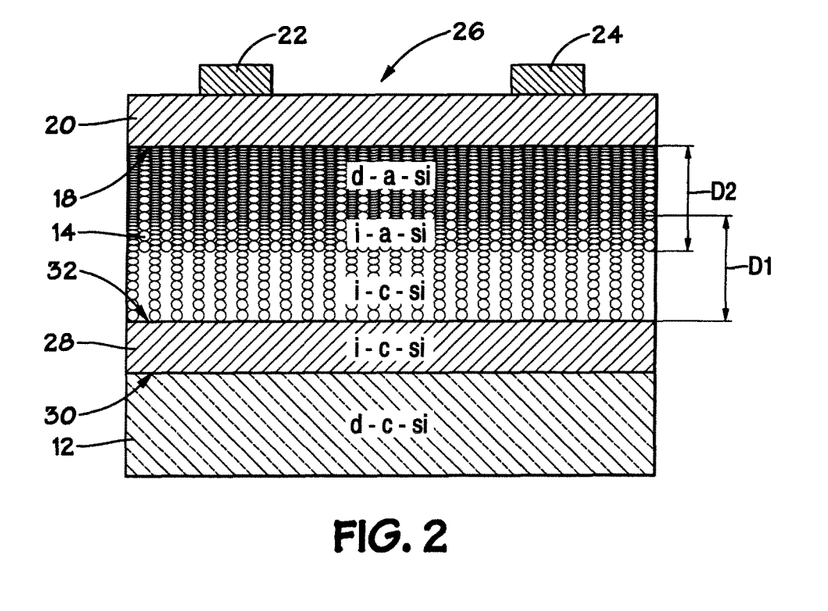
FIG. 2 is a schematic cross-section which depicts the structure of a photovoltaic device according to another embodiment of the present invention.

Referring now to FIG. 2, an alternate embodiment of the device of FIG. 1 is illustrated, and generally designated by the reference numeral 26. In this figure, elements similar or identical to those of FIG. 1 are not labeled, or are provided with the same element numerals. In the device 26, rather than growing or depositing the semiconductor layer 14 directly on the substrate 12, an epitaxial layer 28 is grown directly on the surface of the substrate 12. As will be appreciated, the epitaxial layer 28 will be both crystalline (as with the underlying substrate 12) and intrinsic. The epitaxial layer provides a first barrier for electrons. The epitaxial layer 28 should be of high quality with a low defect density, such that no defective areas at the wafer interface 30, exist. Thus, the epitaxial layer 28 is grown directly on the substrate 12 at the interface 30 and the semiconductor layer 14 is deposited on the epitaxial layer 28, forming an interface 32.

Test results have indicated that epitaxial growth on top of a crystalline substrate, such as a silicon substrate, is possible, especially for a very thin layer. Thicker layers tend to break up and become more amorphous and/or micro-crystalline. Epitaxial growth typically removes the interface, and thus the defect density at this interface is low. As will be appreciated, the uniformity of the epitaxial layer 18 has reduced grained boundaries.

While FIG. 2 illustrates an epitaxial layer 28, having an intrinsic crystalline structure, and the lower region of the semiconductor layer 14, having an intrinsic crystalline structure, it will be appreciated that in an alternative embodiment employing the epitaxial layer 28, the structural grading may occur virtually immediately, as deposition of the semiconductor layer 14 begins. That is, a small amount of dopant may be added to the plasma stream from the beginning of the deposition process of the semiconductor layer 14. As will be appreciated, the intrinsic crystalline epitaxial layer 28 may provide a sufficiently desirable interface between the semiconductor layer 14 and the substrate 12, without formation of the purely intrinsic crystalline region of the semiconductor layer 14.

Figure 3:
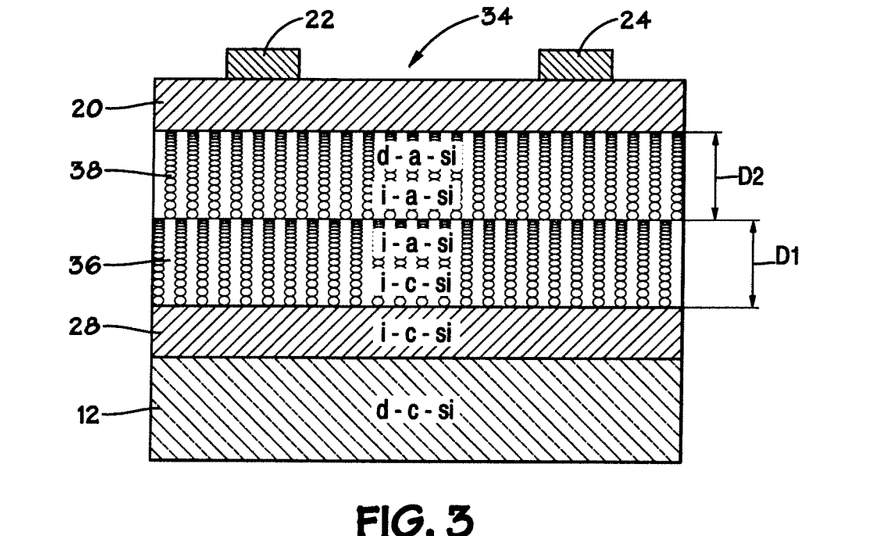
FIG. 3 is a schematic cross-section which depicts the structure of a photovoltaic device according to another embodiment of the present invention.
Figure 4:
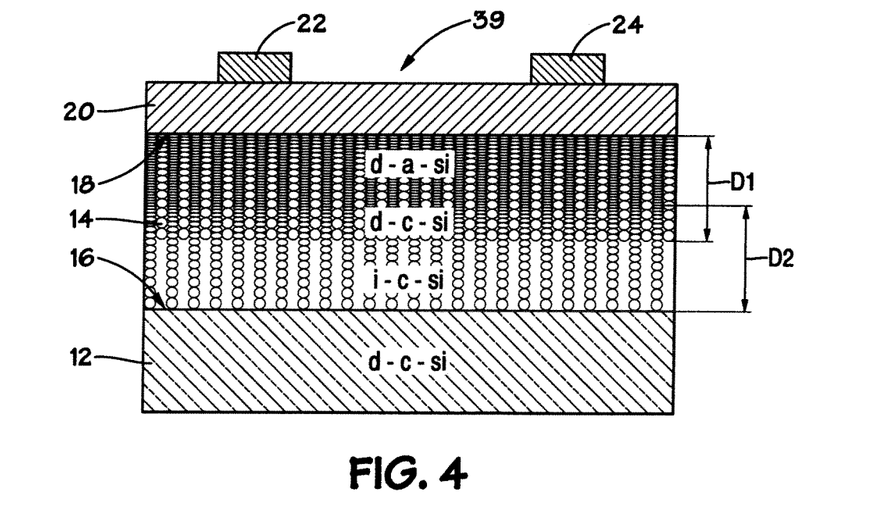
FIG. 4 is a schematic cross-section which depicts the structure of a photovoltaic device according to another embodiment of the present invention.

Turning now to FIG. 3, another alternate embodiment of the device of FIG. 1 is illustrated, and generally designated by the reference numeral 34. In this figure, elements similar or identical to those of FIG. 1 are not labeled, or are provided with the same element numerals. In the device 28, rather than growing or depositing the semiconductor layer 14 in a single step, while gradually increasing the dopant added to the plasma stream during deposition of the semiconductor layer 14, two processing steps are used to form two separate layers 36 and 38. The first semiconductor layer 36 is deposited under a first set of conditions, providing a structurally graded semiconductor layer 36. The second semiconductor layer 38 is deposited under a second set of conditions, providing a compositionally graded semiconductor layer 38.

Turning now to FIG. 4, another embodiment of the device of FIG. 1 is illustrated, and generally designated by the reference numeral 39. In this figure, elements similar or identical to those of FIG. 1 are not labeled, or are provided with the same element numerals. In the device 39, rather than, beginning the structural grading process before the compositional grading process, as in FIG. 1, the compositional grading, defined through the depth D2, may begin before the structural grading, defined through the depth D1. That is, the semiconductor layer 14 may transition from intrinsic to doped before it transitions from crystalline to amorphous.

Figure 5:
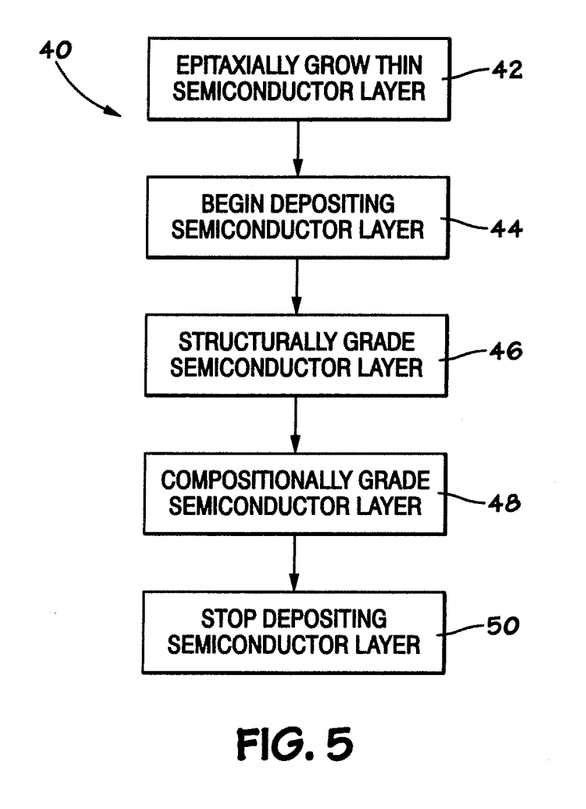
FIG. 5 is flow chart describing an example of a method of fabricating the structure of FIG. 2 according to an embodiment of the present invention.

Referring now to FIG. 5, a method 40 of forming a device in accordance with the embodiments described above with regard to FIGS. 1-4, is provided. As indicated in block 42 of the method 40, a thin epitaxial layer (e.g., epitaxial layer 28) may be grown on the surface of the substrate, as described above with regard to FIG. 2, and indicated. As indicated, in certain embodiments, block 42 may be eliminated from the method 40. Next, a semiconductor layer (e.g., semiconductor layer 14) is deposited, as indicated in block 44. After the deposition/formation of the semiconductor layer begins, the structural grading of the semiconductor may be initiated, as described above, to gradually convert the semiconductor layer from a crystalline state to an amorphous state, as indicated in block 46. Next, the compositional grading of the semiconductor layer may be initiated, as described above, to gradually convert the semiconductor layer from intrinsic to doped, as indicated in block 48. As also described above, the compositional grading and structural grading regions (e.g., defined by the depths D1 and D2), may overlap, partially or completely, or may not overlap. Still further, the compositional grading block 48 may be eliminated from the method 40. Finally, once the semiconductor layer is of a desired thickness and dopant concentration, the deposition of the semiconductor layer may be terminated, as indicated in block 50.

In each of the embodiments described herein, the graded semiconductor layer 14 eliminates at least one interface between discrete multilayers, i.e., interfaces where charge carrier-recombination can occur, as discussed previously. Structural-grading from a crystalline state to an amorphous state is thought to decrease the tunnel barrier for the holes. Structural-grading is also thought to reduce band-bending and resulting barrier effects from band-bending. Compositional-grading of the dopant concentration through a single layer allows for thinner effective p-layers, and thereby reduces the leakage current. Moreover, the graded layer can also result in processing advantages during fabrication of the devices, as mentioned previously. For example, interruptions between deposition steps are minimized, so that there is less of an opportunity for the entry of contaminants.

The semiconductor structure described above is sometimes referred to as a "solar cell device". One or more of these devices can be incorporated into the form of a solar module. For example, a number of the solar cells can be electrically connected to each other, in series or in parallel, to form the module. (Those of ordinary skill in the art are familiar with details regarding the electrical connections, etc). Such a module is capable of much greater energy output than the individual solar cell devices.

Non-limiting examples of solar modules are described in various references, e.g., U.S. Pat. No. 6,667,434 (Morizane et al), which is incorporated herein by reference. The modules can be formed by various techniques. For example, a number of solar cell devices can be sandwiched between glass layers, or between a glass layer and a transparent resin sheet, e.g., those made from EVA (ethylene vinyl acetate). Thus, according to some embodiments of this invention, solar modules contain at least one solar cell device which itself comprises a structurally-graded semiconductor layer or a structurally-graded and compositionally-graded semiconductor layer adjacent a semiconductor substrate, as described previously. The use of the graded layers can improve device properties like photoelectric conversion efficiency, etc., and thereby improve the overall performance of the solar module.

The Morizane et al reference also describes various other features for some of the solar modules. For example, the patent describes "two-side incidence"-type solar modules in which light can contact both front and rear surfaces of the module. Moreover, the patent describes solar modules which must be extremely moisture-proof (e.g., those used outdoors). In these types of modules, sealing resins can be used to seal the side of each solar cell element. Furthermore, the modules may include various resinous layers which prevent the undesirable diffusion of sodium from nearby glass layers. All of these types of solar modules may incorporate devices which comprise the compositionally-graded amorphous layer (or layers) described herein.

In general, those skilled in the art are familiar with many other details regarding the primary components of the solar modules, e.g., the various substrate materials, backing materials, and module frames. Other details and considerations are also well-known, e.g., wire connections in and out of the module (for example, those leading to an electrical inverter); as well as various module encapsulation techniques.

EXAMPLE

The example which follows is merely illustrative, and should not be construed to be any sort of limitation on the scope of the claimed invention.

This example provides a non-limiting illustration of the fabrication of photovoltaic devices according to some embodiments of the present invention. Monocrystalline or polycrystalline semiconductor substrates of one conductivity type are placed in a plasma reaction chamber (for example: a plasma enhanced chemical vapor deposition system). A vacuum pump removes atmospheric gases from the chamber. The substrates to be processed are preheated to about 120 to about 240° C. A hydrogen plasma surface preparation step is performed prior to the deposition of the compositionally graded layer. For chambers typically utilized for the processing of a single 4" wafer, Hydrogen ($H_2$) is introduced into the chamber at a flow rate of about 50 to about 500 sccm (standard cubic centimeters per minute). A throttle valve is used to maintain a constant processing pressure in the range of about 200 mTorr to about 1000 mTorr. Alternating frequency input power with a power density in the range of about 6 mW/cm$^2$ to about 50 mW/cm$^2$ is used to ignite and maintain the plasma. Applied input power can be from about 100 kHz to about 2.45 GHz, and more specifically, 13.56 MHz is used. Hydrogen plasma surface preparation time is about 1 to about 60 seconds.

At the end of the hydrogen plasma preparation step, an optional epitaxial film can be formed on the surface of the substrate by a CVD process, for example. Once the epitaxial film is formed, the deposition of the semiconductor layer may begin, wherein the deposition plasma uses high hydrogen to silane ratios, to promote crystal formation in the growing film. Decreasing the hydrogen content and increasing the diborane ($B_2H_6$) or trimethylborane (TMB) flow will provide the structural grading of the semiconductor layer from crystalline to amorphous. Besides the hydrogen flow and the dopant flow, other parameters like pressure and power can be changed to cause structural grading from crystalline to amorphous, as will be appreciated by those of ordinary skill in the art.

After or during structural grading of the semiconductor layer, depending on the mechanism that is chosen to break-up the crystal growth, diborane ($B_2H_6$) or trimethylborane (TMB) is introduced into the process chamber at a flow rate of about 1 sccm to about 50 sccm. This will initiate the deposition of the compositionally-graded single amorphous semiconductor layer. Because no dopant precursors are included in the plasma at the start of film growth, the composition of the layer is initially intrinsic (undoped), thus serving to passivate the surface of the semiconductor substrate. As the deposition process progresses, a dopant precursor is subsequently added to the plasma mixture. Examples of dopant precursors are: $B_2H_6$, $B(CH_3)_3$, and $PH_3$. These may be in pure form or diluted with a carrier gas such as argon, hydrogen or helium, or together with SiH4. The flow rate of the precursor is increased over the course of the compositionally-graded layer deposition. This forms a gradient in the doping concentration through the single layer. At the conclusion of the graded layer deposition process, concentrations of dopant precursor in the plasma are such that substantially doped amorphous semiconductor properties are achieved.

In one embodiment, an n-type monocrystalline silicon wafer is used as the substrate. After the hydrogen plasma surface preparation (which is optional), the structurally-graded layer deposition is started. A mixture of pure hydrogen and silane may be used initially to form intrinsic (undoped) material properties that serve to passivate the substrate surface. Subsequently, a boron-containing precursor is incrementally introduced to the plasma. Since boron acts as a p-type dopant, the material begins to take on p-type electrical properties. This process proceeds with increasing boron-containing precursor flows until substantially conductive material properties are achieved. As a result, a compositionally-graded layer comprising a boron concentration that continuously varies over its thickness is obtained. The thickness of the graded layer is optimally less than or equal to about 250 Angstroms. This layer will form part of the front structure of the compositionally-graded device.

A similar procedure is followed to passivate the interface with the substrate surface on the opposite side of the device, to form a back surface field (BSF). The difference is that instead of a boron-containing precursor material, a phosphorous-containing precursor is used. Since phosphorous is an n-type dopant, the material begins to take on n-type electrical properties as the deposition progresses. At the conclusion of the compositionally-graded layer deposition, substantially conductive material properties are achieved. In this case, a compositionally-graded layer comprising a phosphorous concentration that continuously varies over its thickness is obtained. Again, the thickness of the compositionally graded layer is optimally less than or equal to about 250 Angstroms. This layer will form part of the rear structure of the compositionally-graded device.

A transparent conductive oxide (TCO) coating can be deposited on the front and rear compositionally-graded layers, in order to form electrodes. These coatings may be, for example, indium tin oxide (ITO) or doped zinc oxide (ZnO). The TCO properties, including thickness, can be selected such that these layers act as antireflective (AR) coatings. Metal contacts (e.g., Al, Ag, and the like) are formed on the front and rear electrodes, to convey the electric current generated by the device.

While preferred embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the claimed inventive concept. All of the patents, patent applications (including provisional applications), articles, and texts which are mentioned above are incorporated herein by reference.

What is claimed:

1. A semiconductor structure, comprising:
    a doped crystalline semiconductor substrate; and
    a semiconductor layer disposed on the doped crystalline semiconductor substrate, the semiconductor layer having a structurally graded region through a first depth from a substantially crystalline state at a lower portion of the structurally graded region to a substantially amorphous state at an upper portion of the structurally graded region,
    wherein the lower portion of the structurally graded region is disposed in direct contact with the doped crystalline semiconductor substrate, and wherein the lower portion of the structurally graded region comprises crystals such that the width of the crystals is substantially wider than the thickness of the lower portion.

2. The semiconductor structure, as set forth in claim 1, wherein the semiconductor layer further comprises a compositionally graded region through a second depth from a substantially intrinsic state at a lower portion of the compositionally graded region to a substantially doped state at an upper portion of the compositionally graded region.

3. The semiconductor structure, as set forth in claim 2, wherein the structurally graded region and the compositionally graded region at least partially overlap.

4. A photovoltaic device, comprising
    a first electrode;
    a second electrode; and
    a semiconductor structure disposed between the first electrode and the second electrode, the semiconductor structure comprising:
        a doped crystalline semiconductor substrate; and
        a semiconductor layer disposed on the doped crystalline semiconductor substrate, the semiconductor layer having a structurally graded region through a first depth from a substantially crystalline state at a lower portion of the structurally graded region to a substantially amorphous state at an upper portion of the structurally graded region,
    wherein the lower portion of the structurally graded region is disposed in direct contact with the doped crystalline semiconductor substrate, and wherein the lower portion of the structurally graded region comprises crystals such that the width of the crystals is substantially wider than the thickness of the lower portion.

* * * * *

UNITED STATES PATENT AND TRADEMARK OFFICE
CERTIFICATE OF CORRECTION

PATENT NO.        : 8,962,978 B2                                       Page 1 of 1
APPLICATION NO.   : 12/959631
DATED             : February 24, 2015
INVENTOR(S)       : Korevaar et al.

It is certified that error appears in the above-identified patent and that said Letters Patent is hereby corrected as shown below:

In the Specification

In Column 1, Line 10, delete "2008," and insert -- 2008, now Pat. No. 7,906,723, --, therefor.

In Column 6, Line 27, delete "layer 12" and insert -- layer 14 --, therefor.

In Column 10, Line 55, delete "layer 18" and insert -- layer 28 --, therefor.

Signed and Sealed this
Thirtieth Day of June, 2015

Michelle K. Lee
*Director of the United States Patent and Trademark Office*